(12) United States Patent
Singer et al.

(10) Patent No.: US 7,626,770 B2
(45) Date of Patent: Dec. 1, 2009

(54) ILLUMINATION SYSTEM WITH ZOOM OBJECTIVE

(75) Inventors: Wolfgang Singer, Aalen (DE); Jens Ossmann, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 125 days.

(21) Appl. No.: 11/696,956

(22) Filed: Apr. 5, 2007

(65) Prior Publication Data

US 2007/0236784 A1    Oct. 11, 2007

Related U.S. Application Data

(60) Provisional application No. 60/793,995, filed on Apr. 11, 2006.

(30) Foreign Application Priority Data

Apr. 11, 2006  (DE) .................. 10 2006 017 336
Mar. 28, 2007  (EP) .................. 07006340

(51) Int. Cl.
   *G02B 27/10*   (2006.01)
   *G03B 27/54*   (2006.01)
(52) U.S. Cl. .................... 359/726; 355/67
(58) Field of Classification Search .............. None
   See application file for complete search history.

(56) References Cited

U.S. PATENT DOCUMENTS

| | | |
|---|---|---|
| 5,237,367 A | 8/1993 | Kudo |
| 6,195,201 B1 | 2/2001 | Koch et al. |
| 6,198,793 B1 | 3/2001 | Schultz et al. |
| 6,438,199 B1 | 8/2002 | Schultz et al. |
| 6,658,084 B2 | 12/2003 | Singer |
| 6,704,095 B2 | 3/2004 | Schultz |
| 2006/0132747 A1* | 6/2006 | Singer et al. .......... 355/67 |

FOREIGN PATENT DOCUMENTS

WO    WO 2006/021419    3/2006

* cited by examiner

*Primary Examiner*—Alicia M Harrington
(74) *Attorney, Agent, or Firm*—Fish & Richardson P.C.

(57) ABSTRACT

Illumination systems which are designed to illuminate a field in a field plane and simultaneously illuminate a pupil plane with radiation from a light source are disclosed.

32 Claims, 11 Drawing Sheets

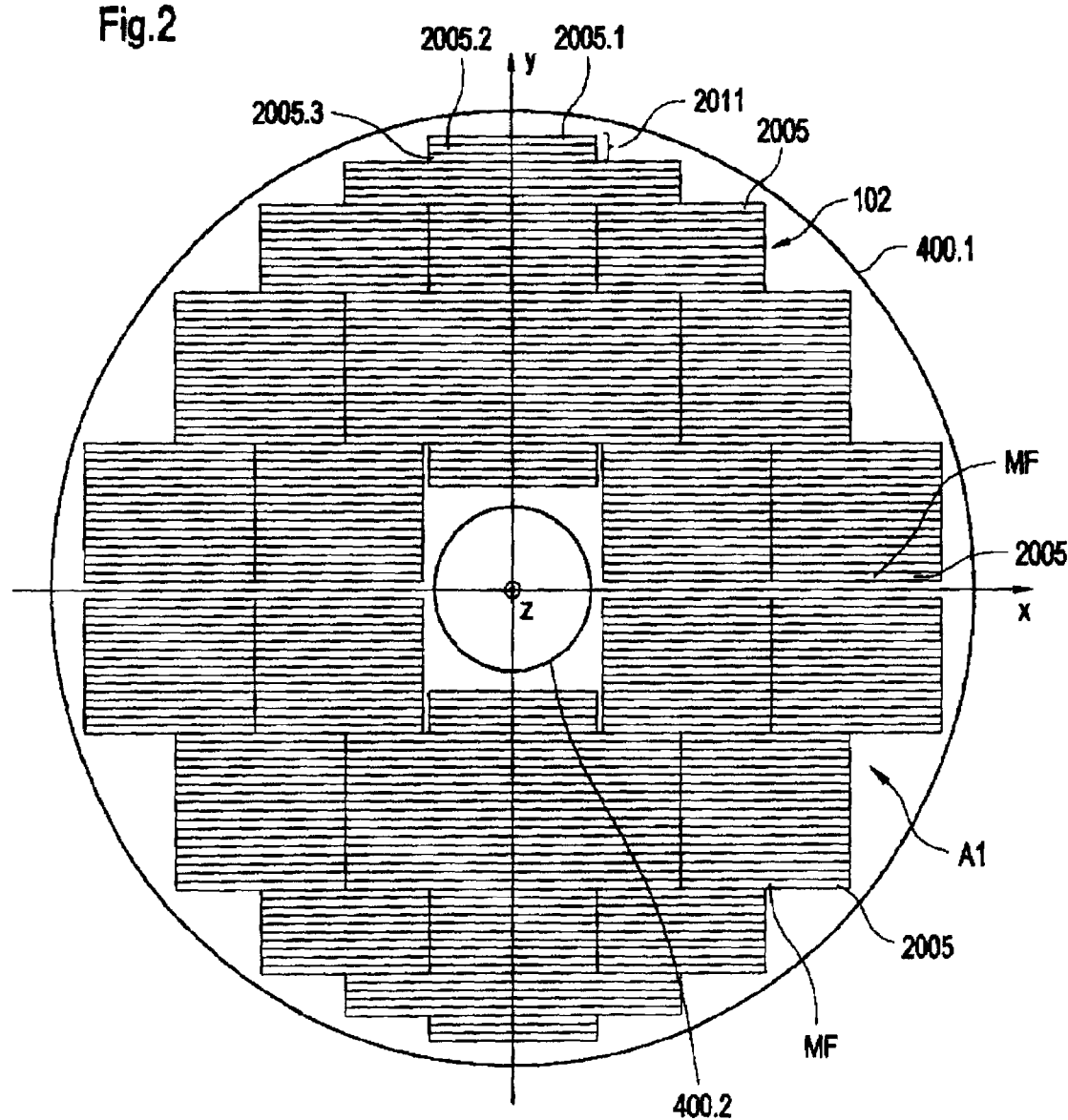

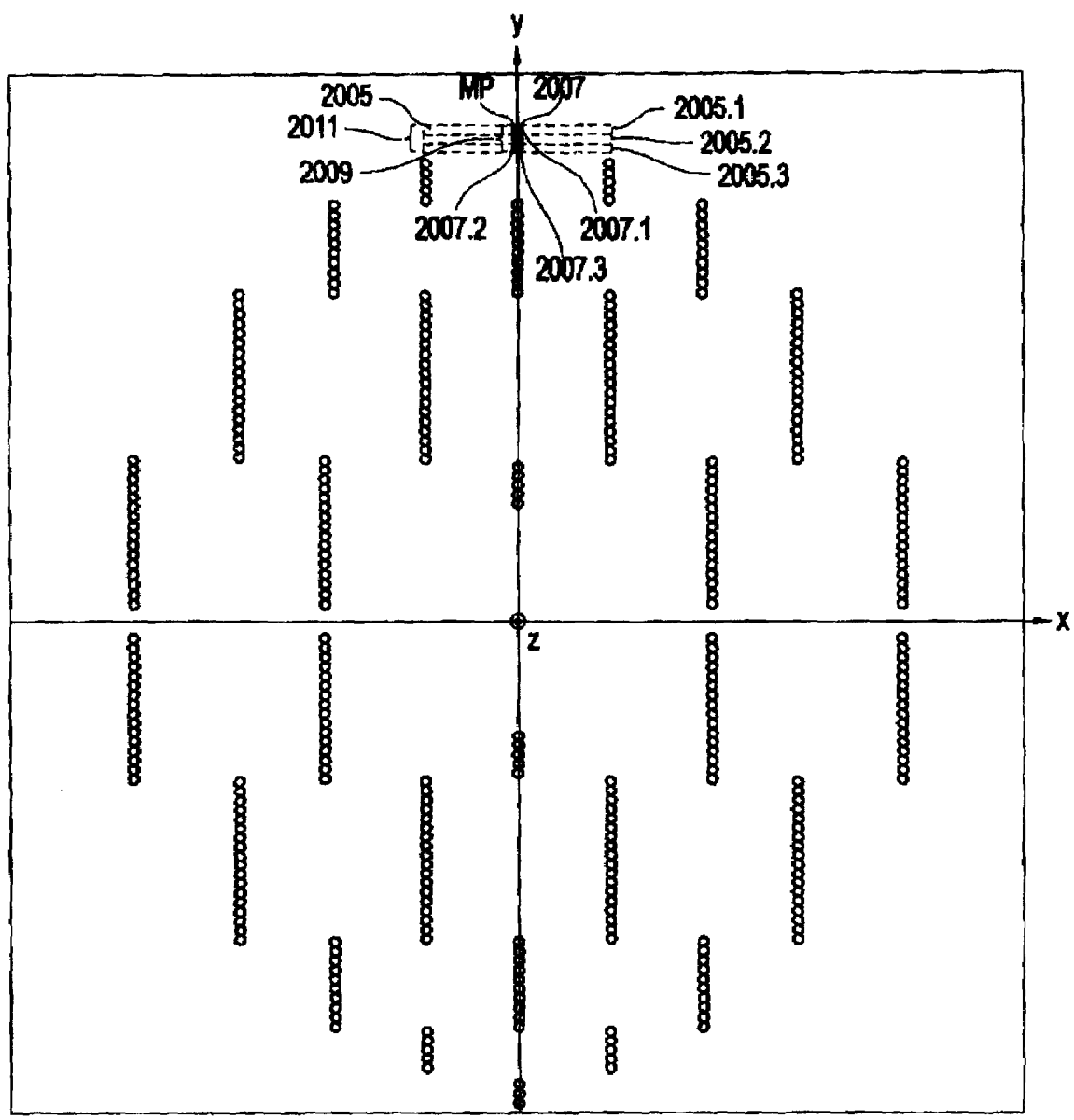

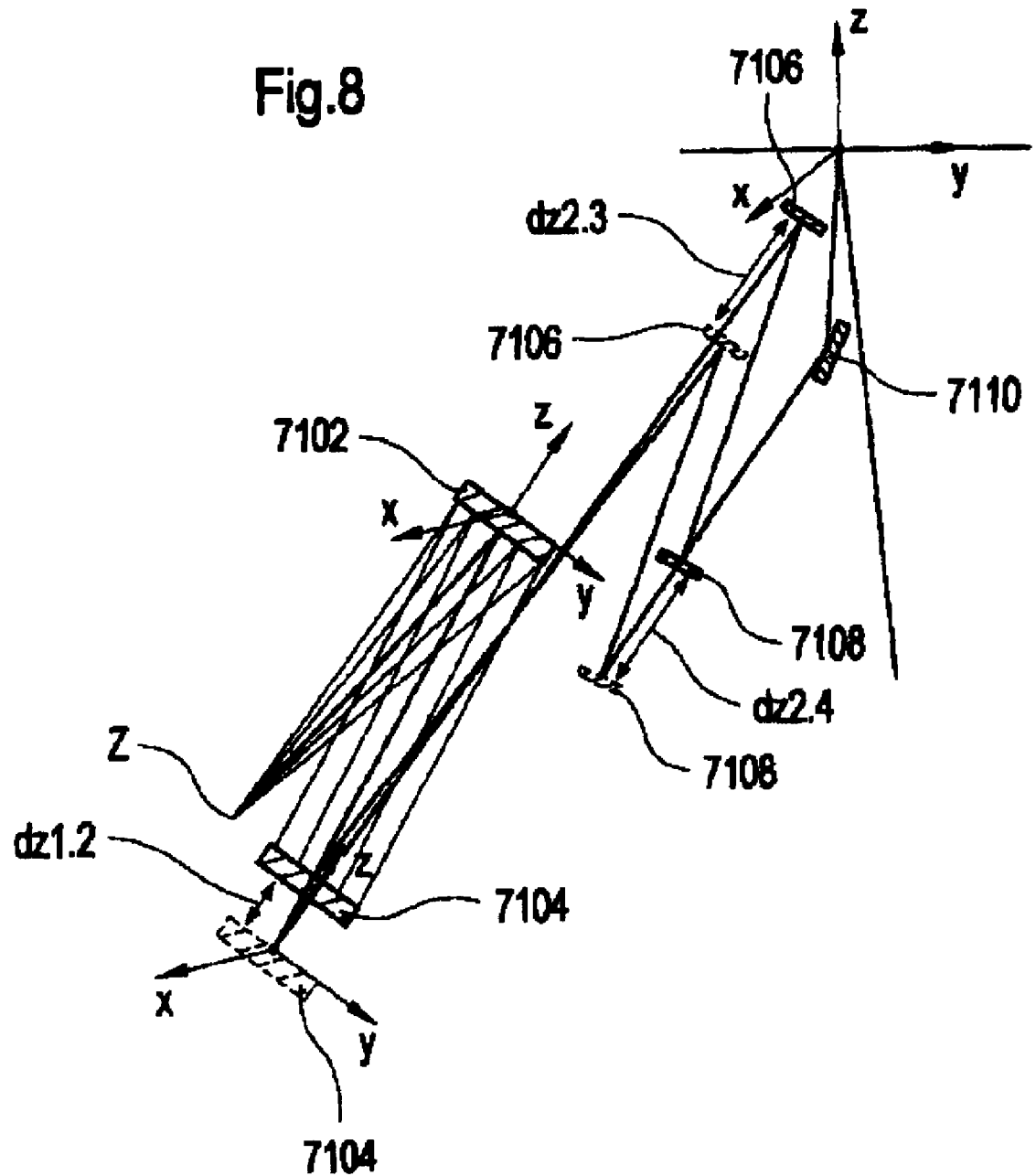

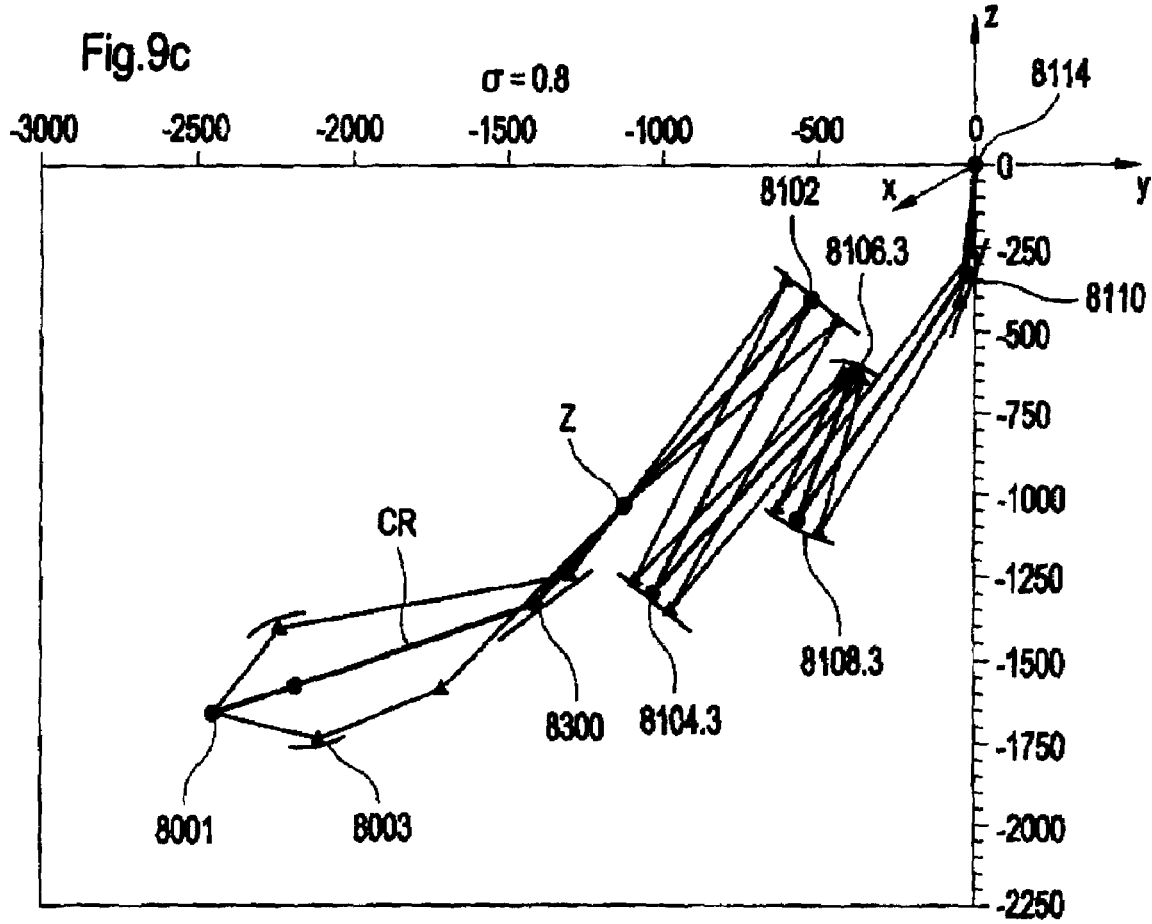

ILLUMINATION SYSTEM WITH ZOOM OBJECTIVE

CROSS-REFERENCE TO RELATED APPLICATIONS

This application claims benefit under U.S.C. §119 to U.S. provisional application 60/793,995, filed Apr. 11, 2006. This application also claims priority under U.S.C. §119 to German Patent Application No. 10 2006 017 336, filed on Apr. 11, 2006, and European Patent Application No. 07006340, filed Mar. 28, 2007. The full disclosure of these earlier applications is incorporated herein by reference.

FIELD

The disclosure relates to an illumination system which is designed to illuminate a field in a field plane and simultaneously illuminate a pupil plane with radiation from a light source.

BACKGROUND

Among optical elements that find application in an illumination system or in a projection objective of a projection exposure apparatus, one can make a general distinction between two different classes, i.e. so-called dioptric elements and catoptric elements. Dioptric elements are refractive elements or lens elements, while catoptric elements are reflective elements or mirror elements. An illumination system or a projection objective with exclusively dioptric elements is referred to as a dioptric illumination system or a dioptric projection objective, while a system with exclusively catoptric elements is referred to as a catoptric illumination system or a catoptric projection objective. If refractive as well as reflective elements are used in an illumination system or a projection objective, the latter is referred to as catadioptric illumination system or catadioptric projection objective.

In order to achieve a further reduction in the widths of structures of electronic components, particularly into the sub-micron range, shorter wavelengths can be used for the light that is used in the microlithography process. In the production of structures of this kind, it is desirable to use light with wavelengths of ≦193 nm, i.e. so-called VUV (very deep ultraviolet) radiation, or white X-rays which are also referred to as EUV (extreme ultraviolet) radiation.

Illumination systems for projection exposure apparatus that use this type of radiation are disclosed in a multitude of references. For example U.S. Pat. No. 6,198,793 and U.S. Pat. No. 6,438,199 show an illumination system for the illumination of a field in a field plane and for the illumination of an exit pupil, wherein the illumination system has a first facetted optical element with substantially rectangular raster elements. In systems according to U.S. Pat. No. 6,198,793 and U.S. Pat. No. 6,438,199, the field is formed via a grazing-incidence mirror.

Likewise known from U.S. Pat. No. 6,195,201 is a double-facetted illumination system. However, in this system the field is formed not via a grazing-incidence mirror, but the individual field facets are formed already in the shape of the field, i.e. arc-shaped in the case where a ring field is to be illuminated in the field plane.

The change of the illumination in the pupil of the illumination system, i.e., the change of the illumination setting has been disclosed in the following references.

As described in U.S. Pat. No. 6,658,084, different illuminations, so-called illumination settings, can be established in a pupil plane in a double-facetted illumination system by exchanging the first facetted optical element. However, systems of this kind have the disadvantage that as a rule the second facetted optical element needs to have more facets than the first facetted optical element, which involves a high manufacturing cost.

As a possible alternative to the foregoing solution, aperture stops can be put up in the plane, or a conjugate plane, of the second facetted optical element, i.e. of the facetted optical element with pupil facets. As a further possibility, aperture stops can be used to mask out the light from some of the first raster elements of the first facetted optical element. However, this leads to losses of light.

A system in which that illumination setting is changed by varying the illumination of the field fact mirror is disclosed in U.S. Pat. No. 6,704,095. According to this reference, the setting of the illumination on the first field fact mirror is achieved in different ways, for example via a grazing-incidence mirror or also via a zoom system through which the illumination of the first field facet mirror can be varied.

For refractive—i.e. dioptric—illumination systems, the concept is disclosed in U.S. Pat. No. 5,237,367 how the illumination in the pupil, and thus the illumination setting, can be changed by moving a facetted dioptric element in a pupil plane.

An illumination system for a projection exposure apparatus in a catoptric group, via which the illumination in the pupil plane can be varied, has been disclosed in WO2006/021419.

Illuminations in a pupil plane, so-called illumination settings, can have different shapes, for example a circular, annular, or multi-polar shape. For circular or annular illuminations, the magnitude of the illumination in a pupil plane is described by a filling ratio σ. According to definition, σ=1 if the pupil of the illumination system is completely illuminated. If the pupil is not illuminated in its entirety, the filling ratio is less than 1.

The definitions for the filling ratio are familiar to those of ordinary skill in the pertinent art.

The filling ratio σ for a circular illumination is defined as $$\sigma = \frac{r}{R_{NA}}$$

wherein
r stands for the radius of the illumination in the exit pupil
$R_{NA}$ stands for the radius of the numerical aperture NA of the illumination system, which agrees with the object-side numerical aperture NA of the projection objective of a projection exposure apparatus.

The disclosure provides illumination systems which are suitable in particular for wavelengths ≦193 nm (e.g., ≦100 nm, <14 nm) where a variable setting of an illumination in the exit pupil is possible without encountering the disadvantages of the prior-art arrangements described above.

SUMMARY

Under a first aspect of the disclosure, this task is solved by designing an illumination system to illuminate a field in a field plane with a given illumination intensity, using radiation from a light source of a wavelength λ and to provide an illuminated area of a given shape and size in a pupil plane. The illumination system includes a large number of elements which are arrange in such a way that radiation is directed from the light source to the field plane and to the pupil plane, wherein the illumination system is a catoptric illumination system and the size of the illuminated area in the pupil plane can be continuously varied while, desirably, the shape of the illuminated area in the pupil plane as well as the illuminated area in the field plane remain largely unchanged. Optionally, the size of the illuminated area in the pupil plane can be continuously changed by ±10% (e.g., ±25%, ±40%).

The general term "illuminated area in the field plane" encompasses the field shape, the field size and the intensity distribution (illumination strength) in the field.

Desirably, the continuous variation of the illuminated area is achieved by an arrangement where the distance between at least two optical elements among the large number of optical elements is variable and where the two optical elements include at least one facetted optical element.

The illumination systems and projection exposure apparatus described here can be designed to operate with a large number of different wavelengths, for example wavelengths in the UV or DUV range. The embodiments that are given as examples can be designed for operation at EUV wavelengths. In a further configuration of the disclosure, there can be embodiments designed for use with one or more wavelengths or in a range of wavelengths.

A catoptric illumination system can be designed for a wavelength $\lambda \leq 193$ nm (e.g., $\lambda \leq 100$ nm, $\lambda \leq 14$ nm).

The illumination settings can have different shapes such as for example a circular, annular, or multi-polar shape, for example a quadrupole shape.

The shape of the illuminated area in the pupil plane of an illumination system can be preselected in certain embodiments of the disclosure, for example as described in U.S. Pat. No. 6,658,084 by exchanging optical elements such as the first facetted optical element with raster elements. To realize this concept, the first facetted optical element can for example be arranged on a revolving wheel. With the preselection, the shape of the setting can be determined, for example whether the setting is annular or circular. The disclosure allows varying the size of the illuminated area in the pupil plane while the shape of the illuminated area or the shape of the setting remains largely unchanged.

The large number of elements of the illumination system can include a first facetted optical element and a second facetted optical element. The first facetted optical element and the second facetted optical element in the case where they are configured as catoptric elements each include one mirror carrier on which a multitude of individual mirror facets are arranged.

Among reflective systems, there is a general distinction between so-called normal-incidence elements and grazing-incidence elements. Normal-incidence elements are elements in which all incident rays meet the surface of the element at an angle of $\leq 30°$ relative to the surface-normal direction at the point of incidence (e.g., at an angle of $\leq 20°$, at an angle $\leq 10°$, at an angle $\leq 5°$). Grazing-incidence elements are elements in which all incident rays meet the surface of the element at an angle of $\geq 70°$ relative to the surface-normal direction at the point of incidence (e.g., at an angle of $\geq 80°$, at an angle $\geq 85°$). Accordingly, a normal-incidence element is an optical element with a nearly perpendicular incidence of the light, while a grazing-incidence element is an optical element which is met at a shallow angle by the incident light.

In the light path from the light source to the field plane, the large number of elements can be arranged in such a way that the radiation that is directed from the light source to the field plane and to the pupil plane meets the surface of each normal-incidence element at a maximum angle of incidence $\Theta_{max}$ (max) in the meridional plane of less than 20° (e.g., less than 10°, less than 5°) for all elements of the illumination system.

As a mechanism whereby the light source which often emits undesirable long-wave radiation or particles can be separated from the optical components of the illumination system, an intermediate image of the light source is formed in certain embodiments of the disclosure in the light path ahead of the field plane of the illumination system. The large number of elements of the illumination system includes a first multitude of elements serving to direct radiation from the light source into the intermediate image, and a second multitude of elements serving to direct radiation from the intermediate image to the field plane and to the pupil plane.

The second multitude of elements can include normal-incidence elements and grazing-incidence elements, wherein for the normal-incidence elements, the radiation in the meridional plane of each optical element of the illumination system meets the surface of the optical element at a maximum angle of incidence $\Theta_{max(max)}$ of less than 20° (e.g., less than 10°, less than 5°) and for grazing-incidence elements, the radiation in the meridional plane of each optical element of the illumination system meets the surface of the optical element at an angle of incidence of more than 70° (e.g., more than 80°, more than 85°).

According to a further aspect of the disclosure, the illumination system includes a first optical component having a first facetted optical element with at least one fist raster element and a second facetted optical element with at least one second raster element, wherein the first and the second facetted optical elements are distanced from each other.

The first facetted optical element in a reflective configuration is also referred to as a honeycombed field mirror and the second facetted optical element in a reflective configuration is referred to as honeycombed pupil mirror.

The illumination system further encompasses the at least one second optical component which is arranged after the first optical component in the light path from a light source to a field plane.

According to the further aspect of the disclosure a first setting device is provided in the illumination system, which allows the distance to be set between the first facetted optical element and the second facetted optical element, and a second setting device that allows the focal length of the second component to be set. The setting via the setting device is possible also in particular while the lithography system is running. This means that the illumination settings in the pupil plane can be changed during operation by moving the optical components involved, without requiring the system to be out of operation for an extended period of time.

It has been discovered that a setting of the illuminated area and thus of the illumination setting in the exit pupil is possible also in a reflective, i.e. catoptric, system by shifting the position of optical elements. Until now, this has been considered by individuals skilled in the art as being achievable only with great difficulty, because is impossible in reflective systems to unambiguously define an optical axis for the overall system, and in particular for the illumination system. The disclosure provides in particular that the size of the illuminated area in the exit pupil can be set by changing the position of the optical component, while the shape of the illuminated area is largely preserved.

The solution according to the second aspect of the disclosure is distinguished by the fact that the focal length of the second optical component, which is also referred to as optical condenser, is adjustable, whereby it becomes possible to vary the illumination, in particular the size of the illuminated area in an exit pupil plane, and thus to vary the illumination setting of the illumination system. The optical condenser is configured as a zoom system, whereby it becomes possible to provide an illumination of the pupil, and thus an illumination setting, that is variable. A change in the focal length of the second optical component normally also has an influence on the field image, i.e. the size of the field. However, in the present system, this can be compensated, because by changing the distance between the first facetted optical element and the second facetted optical element the change in the field image can be compensated without thereby influencing the pupil image, because a change of the distance between a first facetted optical element and a second facetted optical element has no influence on the pupil image. By changing the distance between the first facetted optical element and the second facetted optical element through the first setting device, the field illumination can be kept constant even if the pupil illumination is changed. This means in other words that the pupil image can be influenced without thereby influencing the field image. The general term "field illumination" encompasses the shape and size of the illuminated area in the field as well as the intensity distribution (illumination strength) in the field.

The first facetted optical element with raster elements has the general function to subdivide an incident ray bundle arriving from the light source into a multitude of ray bundles, each of which is associated with one of the raster elements. Each ray bundle that is associated with a first raster element has a median ray. In the present context, the median ray is that ray which originated from the geometrical center of a first raster element and is directed at the geometrical center of a second raster element. Since the first raster elements determine the image in the field plane of the illumination system, they are also referred to as field raster elements. The system can be designed in such a way that all median rays which originate from the different field pints run substantially parallel to each other, each of them falling on the second raster element that is associated with respective first raster element, wherein the correlation between raster elements does not change even if the first facetted optical element is moved in relation to the second facetted optical element. Thus, the assignment of channels from a first raster element to a second raster element remains invariant even when the distance is changed.

If the ray paths of the individual channels are not parallel to each other, then the individual field- and pupil raster element can be designed in a way that allows them to be tilted. Together with a linear displacement, the tilt angles are changed, and the correlation between field- and pupil facets is likewise preserved in such a case.

In some embodiments, only a small number of optical elements are moved. In a further developed embodiment of the disclosure it is therefore envisioned that only the second facetted optical element, the so-called pupil facet mirror is moved via the first setting device, as a way of varying the distances from the first to the second facetted optical element and from the second facetted optical element and the first optical element. This kind of a system can have the advantage that only one optical component needs to be moved, so that the mechanical structure is significantly easier to realize, since only a small number of elements are subject to a mechanical movement.

If the system is one in which exactly two zoom positions are realized, it can be advantageous if for varying the distance the second facetted optical element is moved from a first position to a second position via the first setting device, and the focal length of the first raster elements is selected so that the intermediate image of the light source which is formed by the first raster elements is generated substantially at the exact midpoint between the first position and the second position, i.e. the intermediate image is located halfway between the first and the second position. The second facetted optical element will in this case be defocused relative to the intermediate image, and the individual pupil raster elements of the second facetted optical element will receive for example a substantially elliptic illumination. The elliptic illumination occurs in the case of a circular, symmetric intermediate focus and with first raster elements whose aspect ratio is different from 1. If the intermediate focus is positioned in this way, the sizes of the illuminated areas in both zoom positions are largely identical. If the intermediate image is defocused, the size of the illuminated area is determined by the size of the field aperture stop. In the present example, the aperture stop is determined by the size of the field raster elements. With field raster elements that are for example rectangular with dimensions of 3×25 mm, the illuminated area changes hardly at all in the x-direction, while it becomes elongated in the y-direction. The result of this is the approximately elliptical shape of the intermediate image of the light source.

In some embodiments, the shape of the pupil raster elements is adapted to the respective illuminations in the first and/or in the second position of the second facetted optical element. For example, the second raster elements or pupil raster elements may have an elliptical shape.

As described above, a field is illuminated in a field plane of the illumination system. The shape of the field, also referred to as the field shape, is for example an arcuate shape. In a first embodiment of the disclosure, the shape of the field facets, also referred to as the facet shape of the first raster elements, is substantially equal to the field shape of the illuminated field, meaning that it is for example an arcuate shape.

In an illumination system in which the field facets have essentially the same shape as the illuminated field, it is sufficient if the second optical component of the illumination system which serves to project an image of the pupil facets into the exit pupil of the illumination system includes a first and a second optical element with optical power, more specifically with refractive optical power.

Optionally, if the first facetted optical element has field raster elements that are configured in the shape of the field in the field plane that is to be illuminated, the second optical component can also include a third optical element without optical power, i.e., without refractive properties, for example a planar mirror.

As an alternative to a double-facetted illumination system where the field facets have substantially the shape of the field to be illuminated, the field facets can also be configured in a rectangular shape. In this case, the second optical component has at least three optical elements, and the shaping of the field can occurs via the third optical component which can be a grazing-incidence mirror.

As a mechanism for changing the illumination in the exit pupil, the focal length of the second optical component can be varied by moving and thereby changing a further distance (AB) between the following optical elements:
  the second facetted optical element and the first optical element,
  the first optical element and the second optical element,
  the second optical element and the third optical element,
  the third optical element and the field plane.

In some embodiments, just one of the aforementioned optical elements is moved via the second setting device. The element to move can be the second optical element of the second optical component. By moving this optical element, the further distance (AB) is varied between the first optical element and the second optical element as well as between the second optical element and the field plane in the case where the second optical component has two optical elements, or between the second optical element and the third optical element in the case where the second optical component has three optical elements.

In the illumination system according to the disclosure, the radiation in a meridional plane of the illumination system can have a maximum angle of incidence ($\Theta_{max(max)}$) of less than 20° (e.g., less than 10°, less than 5°) in a meridional plane on a surface of the first facetted catoptric element and/or the second facetted catoptric element.

In a special embodiment of the disclosure, the further distance (AB) is varied by less than ±20%.

In a further embodiment of the disclosure, the further distance (AB) is varied in such a way that a maximum angle of incidence ($\Theta_{max(max)}$) in a meridional plane onto a surface of the second facetted catoptric element and/or the first optical element and/or the second optical element and/or the third optical element changes by less than 5° (e.g., less than 3°).

In a further developed embodiment, the second facetted catoptric element comprises a surface on which one or more of the second raster elements are arranged, wherein more than 80% (e.g., more than 90%) of the surface is illuminated.

Besides the illumination system, the disclosure also provides a method for varying the illumination in the entry pupil of an illumination system, where the size of the illuminated area is subject to continuous variation, but the shape remains substantially unchanged. To perform this function, the illumination system has for example a first optical component which includes a first facetted optical element and a second facetted optical element, and a second optical component which includes at least a first optical element and a second optical element, where the illumination system illuminates a field in a field plane. The method for varying the sized of the illuminated area encompasses the following steps: First, the focal length of the second optical component is varied for example by moving at least one optical element of the second optical component, which causes a change in the illumination in the exit pupil of the illumination system. For example as a result of the movement, an illumination setting of, e.g., circular shape with a first filling ratio $\sigma(1)$ is changed into an illumination setting with a second filling ration $\sigma(2)$. However, the change in the focal width has an influence not only on the diameter of the illuminated pupil and thus on the illumination or the filling ratio of the circular-shaped setting in the pupil plane, but also on the size of the illuminated field in the field plane. In order to keep the size of the illuminated field in the field plane constant, the distance between the first and the second facetted element is set so that the illuminated field in the field plane is kept largely constant. This is possible, because a variation of the distance from the first facetted optical element to the second facetted optical element has no influence on the size of the pupil to be illuminated in the pupil plane.

As described above, it can be advantageous if the foregoing method which allows the size of the illuminated area to be continuously varied while the shape of the illuminated area in the pupil plane is largely maintained, is used in combination with a method for setting the shape of the illumination.

If such a combination is undertaken, with the shape of the illumination in the pupil plane, i.e. the shape of the illumination setting, preselected, the method according to the disclosure allows the size of the illumination setting to be optimally adapted via the zoom system according to the disclosure, for example to the imaging properties of the optical projection system. The shape of the illumination setting can be selected for example by an exchange of the facetted optical components.

A method for continuously varying an illumination with a shape in a pupil plane of an illumination system, wherein the shape of the illuminated field in the pupil plane remains largely preserved and wherein the illuminated field in the pupil plane has a first size, is carried out with the following steps:

in a first step, the focal length of the second optical component is adjusted, resulting in an illuminated area of a second size in the pupil plane;

in a next-following step of the method, a distance between a first and a second facetted element is adjusted in such a way that the illumination in the field plane which is obtained at the second size is equal to the illumination in the field plane that is obtained at the first size, or vice versa.

The method can be used, for example, if the radiation being used has a wavelength $\lambda$, wherein $\lambda \leq 193$ nm (e.g., $\lambda \leq 14$ nm).

In a special embodiment of the disclosure, the method is performed in such a way that the second size varies by a maximum of ±10% (e.g., a maximum of ±25%, a maximum of ±40%) in relation to the first size.

The illuminated area in the pupil plane can for example be circular, annular or multi-polar, in particular dipolar or quadrupolar.

A special embodiment of the disclosure, where the size of the illuminated area in the pupil plane is characterized by a filling ratio $\sigma$ and where the first size of the illuminated area in the pupil plane corresponds to a first filling ratio $\sigma(1)$ and the second size of the illuminated area in the pupil plane corresponds to a second filling ration $\sigma(2)$ has the property that:

$\sigma(2)$ varies by ±40% relative to $\sigma(1)$, i.e. $\sigma(2)$ is within the range:

$(1+0.40)\cdot\sigma(1)>\sigma(2)>(1-0.40)\cdot\sigma(1)$.

In some embodiments, the filling ratio $\sigma(2)$ is in the range:

$(1+0.25)\cdot\sigma(1)>\sigma(2)>(1-0.25)\cdot\sigma(1)$.

In certain embodiments, the filling ratio $\sigma(2)$ is in the range:

$(1+0.10)\cdot\sigma(1)>\sigma(2)>(1-0.10)\cdot\sigma(1)$.

In a method according to a special embodiment of the disclosure, the first facetted catoptric element includes first raster elements, wherein the first raster elements have the shape of the field in the field plane.

In a method according to the disclosure, the focal length of the second optical component is adjusted by changing the distance between one and another of the following optical elements of the first optical component or the second optical component:

the distance between the second facetted optical element and the first optical element, the distance between the first optical element and the second optical element, the distance between the second optical element and the field plane.

In a method according to the disclosure, the first facetted catoptric element can have first raster elements, wherein the first raster elements are of a rectangular shape.

According to a further aspect of the disclosure, a method is proposed for adjusting an illumination in the pupil plane of a catoptric illumination system, wherein the illuminated area in the pupil plane has a shape and a size in the pupil plane, wherein in a first step the shape of the illuminated area in the pupil plane is adjusted, and in an immediately following second step the size of the illuminated area in the pupil is adjusted, wherein the size of the illuminated area in the pupil plane is adjusted through a continuous variation, while the shape of the illuminated area in the pupil plane and the illumination of the illumination system in the field plane remain largely constant.

Besides the illumination system, the disclosure also provides a projection exposure apparatus containing an illumination system of this kind, in particular for the field of microlithography at wavelengths $\leqq 193$. The projection exposure apparatus projects via a projection objective a mask, the so-called reticle, which is arranged in the field plane of the illumination system, onto a light-sensitive object in an object plane.

If the light-sensitive coating is developed after the exposure, it is possible to obtain a structured layer, e.g. of an integrated circuit. Insofar, the disclosure also discloses a method for producing a semiconductor component, for example an integrated circuit.

The disclosure will hereinafter be described with references to examples of embodiments, but no limitation to the examples nor to the attached drawings is thereby implied.

BRIEF DESCRIPTION OF THE DRAWINGS

In the drawings:

FIG. 2 shows a first facetted optical element with field facets, FIG. 3 shows a second facetted optical element with pupil facets, FIG. 8 shows a second embodiment of a system according to the disclosure with arc-shaped field facets;

FIGS. 9a-c represent embodiments in which the illumination and thus the setting in the pupil is changed by varying the distances from the field facet mirror to the pupil facet mirror.

FIGS. 1a to 1d support the following detailed description of general concepts which are used in and relate to a multitude of embodiments.

FIG. 1 shows the general structure of a microlithography projection exposure apparatus 2100. The microlithography projection exposure apparatus includes a light source 2110, an illumination system 2120, a projection objective 2101, as well as a support structure or work surface 2130. Further shown is a Cartesian x-y-z coordinate system. The radiation of the light source 2110 is directed to an illumination system 2120. The illumination system 2120 influences the radiation originating from the light source 2110, for example by homogenizing the radiation or by directing a ray bundle 2122 of the radiation onto a mask 2140 which is set in place in an object plane 2103. The projection objective 2101 forms an image of the mask 2140 by projecting the radiation reflected from the mask onto a substrate surface 2150 which is set in position in an image plane 2102. The ray bundle on the image side of the projection objective 2101 is labeled with the reference numeral 2152. The substrate 2150 is held or carried by a support structure 2130, wherein the support structure moves the substrate 2150 relative to the projection objective 2101, so that the projection objective 2101 projects an image of the mask 2140 onto different areas of the substrate 2150.

The projection objective 2101 has an optical axis 2105. The individual optical elements of the projection objective are arranged with rotational symmetry about the optical axis 2105. The plane containing the optical axis 2105 is the meridional plane of the projection objective. As shown in FIG. 1a, the projection objective 2101 projects into an image plane 2102 an image of a part of the mask 2140 that does not contain the optical axis 2105 of the projection objective 2101. In alternative embodiments that are not shown here it is also possible to project into the image plane 2102 images of objects that are located on the optical axis 2105 of the projection objective. The light source 2110 is selected so that it provides the electromagnetic radiation with an operating wavelength $\lambda$ at which the microlithography projection exposure apparatus 2100 is operated. In some examples, the light source 2110 is a plasma source or laser plasma source for the emission of EUV radiation in the range of wavelengths from 9 to 14 nm, or an ArF laser with a wavelength of 193 nm.

The operating wavelength $\lambda$ of the microlithography projection exposure apparatus can be in the ultraviolet or extreme ultraviolet (EUV) range of the electromagnetic spectrum. The operating wavelength can in particular be 193 nm or less, and especially 100 nm or less. In the examples of embodiments, it the operating wavelength can be in the EUV range of wavelengths (e.g., around 13 nm).

The use of radiation with an especially short wavelength is particularly desirable because the optical resolution of a projection objective which is used in a projection exposure apparatus is in general roughly in proportion to the operating wavelength being used. Therefore, if shorter wavelengths are used, projection objectives can resolve smaller structures of an image than would be the case with analogous projection objectives that use longer wavelengths.

The illumination system 2120 includes optical components that provide a collimated light beam with a largely homogeneous intensity profile. The illumination system 2120 further includes optical components that serve to direct the ray bundle 2122 onto the mask 2140. In some embodiments, the illumination system 2120 further includes components that provide a specific polarization profile of the ray bundle. Each optical component of the illumination system has a local x-y-z coordinate system assigned which is obtained by a translatory shift and a rotation of an x-y-z coordinate system that is defined in the object plane 2103 at a central field point. The meridional plane of an optical element in the illumination system is the plane of reflection of the principal ray CR. The plane of reflection is formed for example by the local z-axis and the principal ray CR that belongs to the central field point. The local z-axis of each optical element is defined as the surface normal axis at the point of incidence of the principal ray CR.

The image plane 2102 has from the object plane 2103 a distance L which is also referred to as the overall length of the projection objective 2101. This overall length depends in general on the specific design of the projection objective 2101 and on the wavelength at which the microlithography projection exposure apparatus 2100 is being operated. In the examples described herein, the overall length is in the range from one meter to about three meters (e.g., in the range between about 1.5 and 2.5 meters).

Figure 1A:
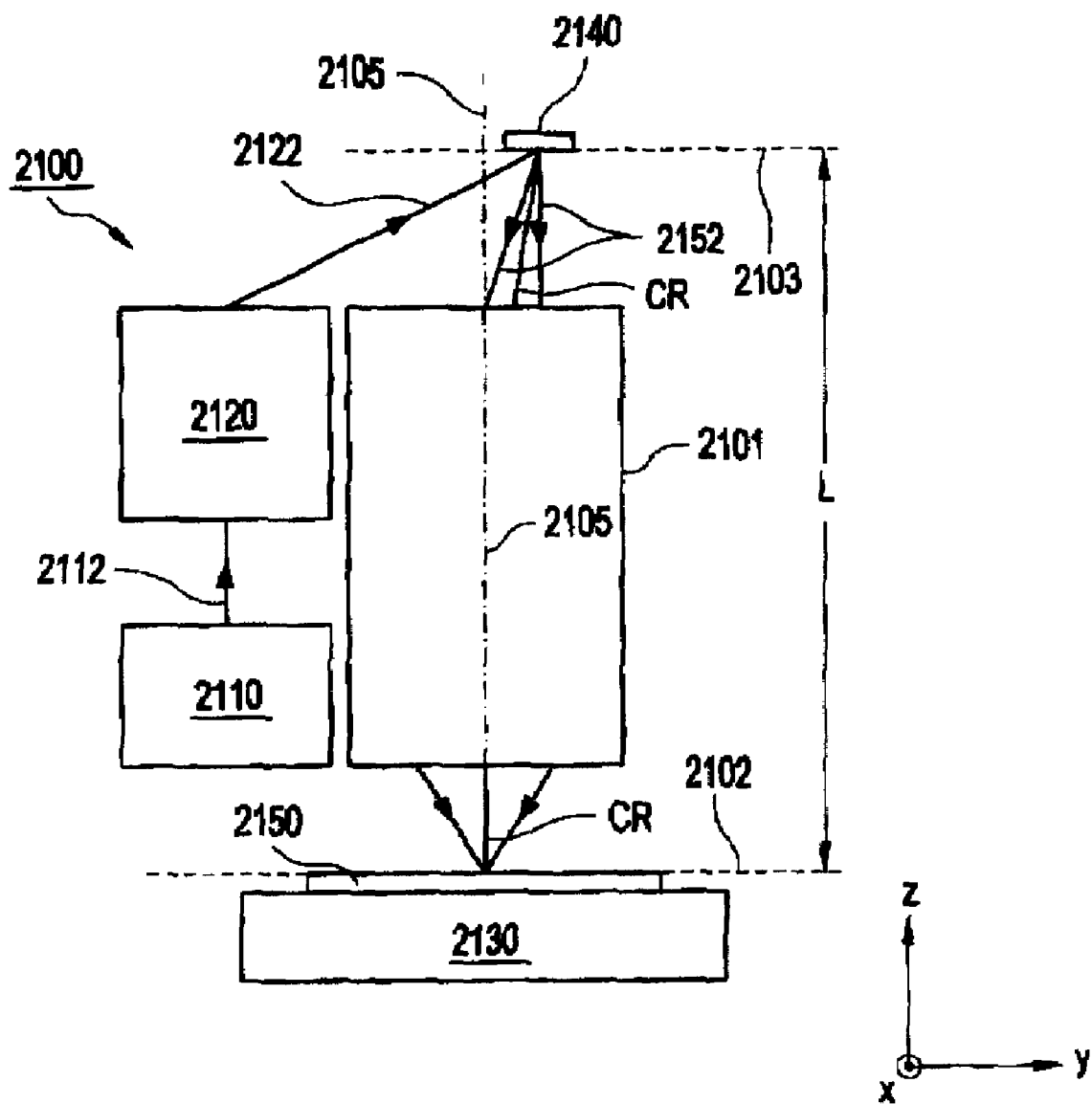
FIG. 1a represents the general structure of a microlithography exposure apparatus.
Figure 1B:
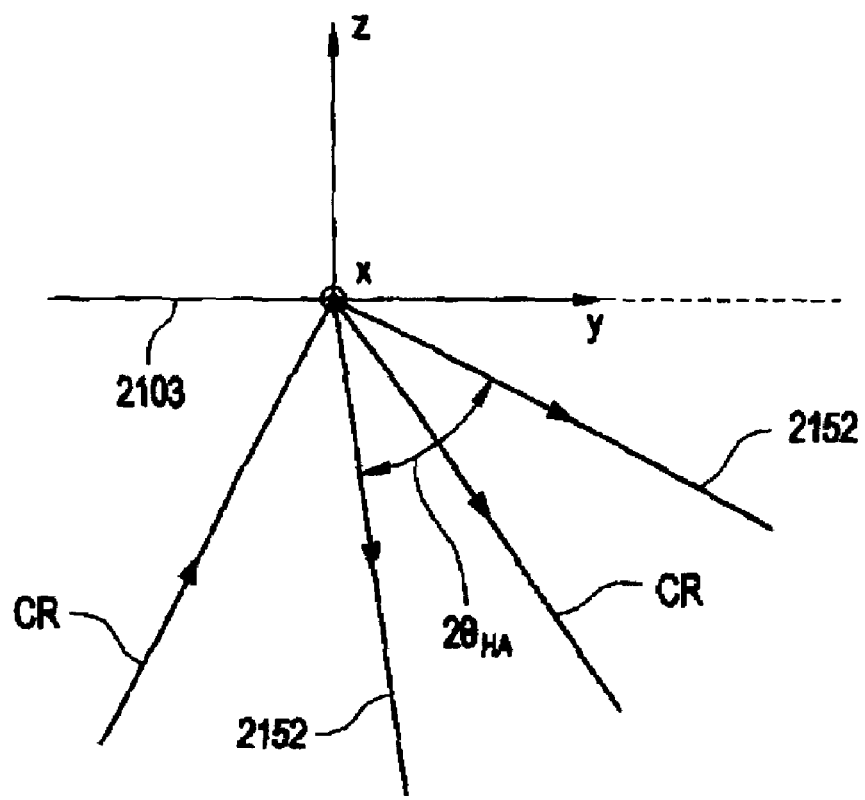
FIG. 1b illustrates the definition of the object-side numerical aperture NA.

FIG. 1b shows the marginal rays 2152 of the light bundle which are reflected at the object in the object plane 2103 and are projected into the image plane 2102. The marginal rays 2152 define a cone of rays.

The angle of the cone of rays is related to the object-side numerical aperture NA of the exit pupil of the illumination system which is also simultaneously the entry pupil of the projection objective. The object-side numerical aperture can be expressed as $$NA = n_0 \cdot \sin \Theta_{NA}$$

wherein $n_0$ stands for the refractive index of the medium that lies adjacent to the object plane 2103. The medium can be for example air, nitrogen, water, or vacuum. The angle $2 \cdot \Theta_{NA}$ represents the angle that is defined by the marginal rays. In the particular case of an illumination system with EUV light, the medium is vacuum which has a refractive index of $n_0 = 1$.

Figure 1C:
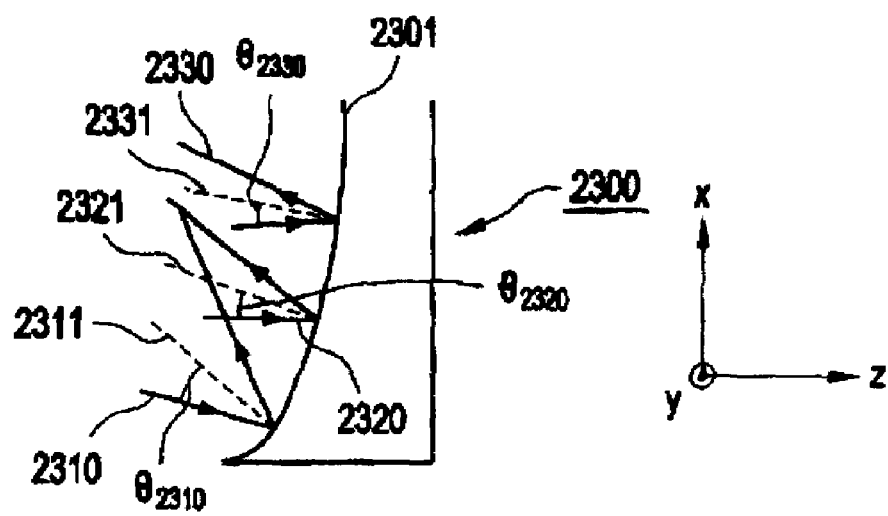
FIG. 1c illustrates the definition of the angles of incidence on a mirror surface.

In general, the portion of the radiation that is reflected by a mirror varies as a function of the angle of incidence on the mirror surface. Since the image-forming ray passing through a catoptric system is propagated along a multitude of different paths, the angle of incidence of the radiation on each mirror can vary. This is shown in FIG. 1c which illustrates a part of a mirror 2300 in a meridional section, i.e. in the meridional plane of the mirror. The meridional plane is the plane of the optical element which contains the local z-axis of the respective optical element as well as the principal ray CR belonging to the central field point of the field that is shown for example in FIG. 1d. The local coordinate system is indicated in FIG. 1c. The mirror 2300 has a concave reflective mirror surface 2301. The image-forming radiation which arrives on the surface 2301 along different paths includes for example the paths that are represented by the rays 2310, 2320, 2330. The rays 2310, 2320 and 2330 fall on a part of the mirror surface 2301. The surface-normal directions on the surface of the mirror vary in this area of the mirror surface 2301. The surface-normal directions in this area are indicated by the lines 2311, 2321 and 2331 which relate to the rays 2310, 2320 and 2330. The rays 2310, 2320 and 2330 meet the surface at the angles $\Theta_{2310}$, $\Theta_{2320}$ and $\Theta_{2330}$. All of the lines 2311, 2321 and 2331 lie in the meridional plane that is defined by the z-axis of the local coordinate systems and the principal ray CR (not shown in the drawing).

For every element of the illumination system 2120 or the projection objective 2100, it is possible to represent the angles of incidence of the image-producing rays along a multitude of paths. One possible form of representation is through the respective maximum angle of the rays that fall on each mirror in the meridional plane of the respective element. This maximum angle is referred to as $\Theta_{max}$. In general, the angle $\Theta_{max}$ can vary between different mirrors of the illumination system or of the projection objective 2101. In certain embodiments of the disclosure, the overall maximum value $(\Theta_{max})_{max}$ for all mirrors of the illumination system or the projection objective can be 20° or less (e.g., 15° or less, 13° or less, 10° or less).

Among reflective systems, a general distinction is made between so-called normal-incidence elements and grazing-incidence elements. Normal-incidence elements are elements in which all incident rays meet the surface of the element at an angle of <30° relative to the surface-normal direction at the point of incidence (e.g., at an angle of <20°, at an angle <10°, at an angle <5°). Grazing-incidence elements are elements in which all incident rays meet the surface of the element at an angle of $\geq 70°$ relative to the surface-normal direction at the point of incidence.

Figure 1D:
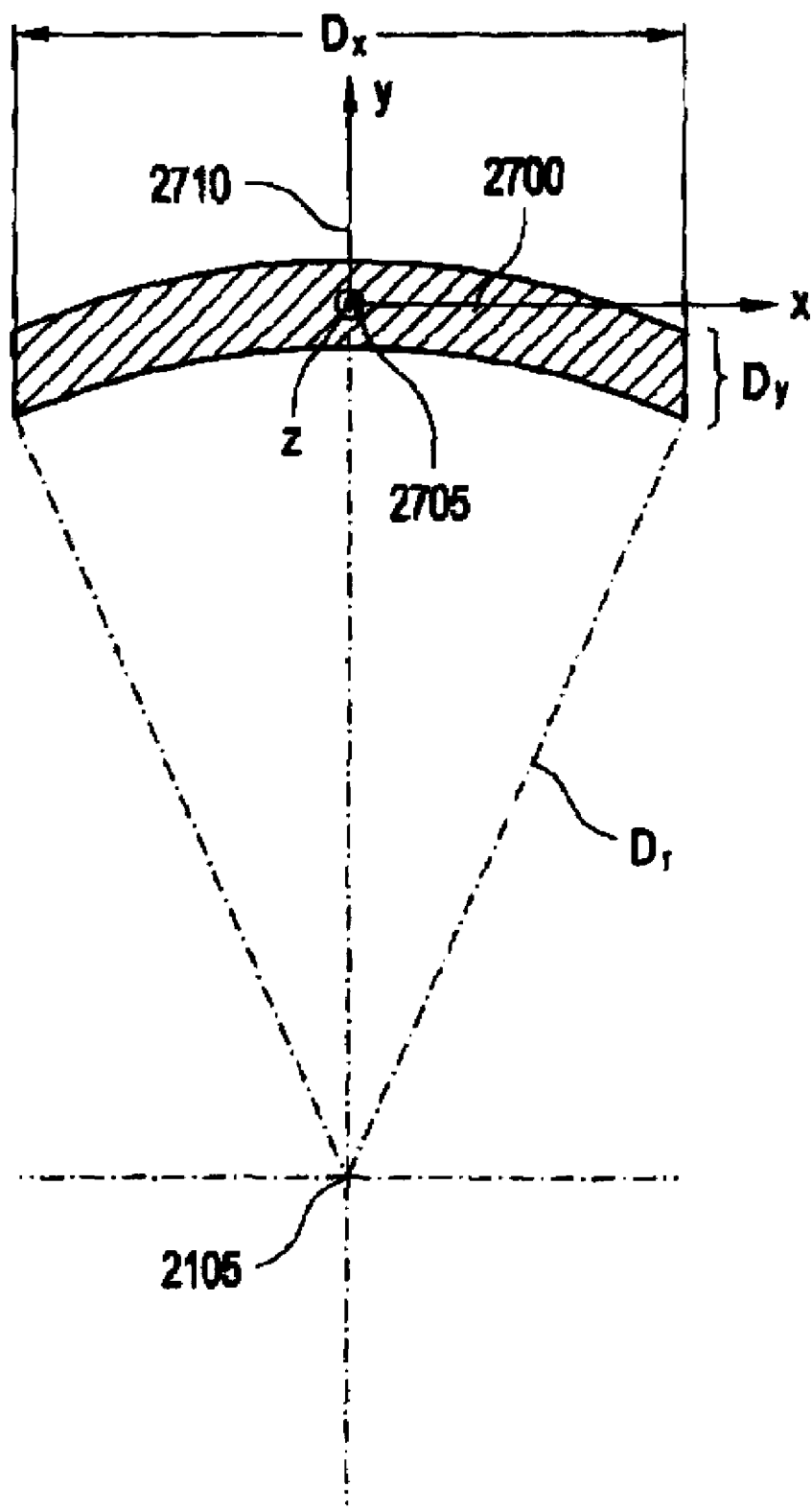
FIG. 1d shows a field in the object plane.

In general, the shape of the field that is formed in the object plane 2103 of the illumination system can vary. In some embodiments, the field can have an arcuate shape, for example the shape of a ring segment, a so-called ring field. FIG. 1d shows a ring segment 2700, also referred to as a ring field. The ring segment 2700 can be characterized by an x-dimension $D_x$, a y-dimension $D_y$, and a radial dimension $D_r$. $D_x$ and $D_y$ are the dimensions of the field as measured, respectively, in the x-direction and in the y-direction of the local coordinate system in the image plane 2102 or in the object plane 2103. The amounts for these dimensions will be named in the following description. For example in a field of $18 \times 1$ mm² in the image plane, the dimension $D_x$ is 18 mm and $D_y$ is 1 mm. The dimension $D_r$ represents the ring radius measured from the optical axis 2105 to the inner border of the field 2700. The ring field segment 2700 is symmetric relative to a plane indicated by the line 2710, which is parallel to the y-z plane. In general, $D_x$, $D_y$ and $D_r$ vary in magnitude, depending on the design of the illumination system and the projection objective 2101. Typically, $D_x$ is larger than $D_y$. The relative sizes of the field dimensions or field measurements $D_x$, $D_y$ and $D_r$ in the object plane 2103 and in the image plane 2102 vary as a function of the magnification or reduction ratio of the projection objective 2101 of the projection exposure apparatus. In some examples, $D_x$ in the image plane 2102 is relatively large.

Generally speaking, for arbitrary field shapes a field in the image plane 2102 can have a maximum field dimension or field measurement, for example $D_x$ for a ring field, of more than 1 mm (e.g., more than 3 mm, more than 4 mm, more than 5 mm, more than 6 mm, more than 7 mm, more than 8 mm, more than 9 mm, more than 10 mm, more than 11 mm, more than 12 mm, more than 13 mm, more than 14 mm, more than 15 mm, more than 18 mm, more than 20 mm, up to more than 25 mm). The other field dimension, for example $D_y$, for a ring field can be in the range between 0.5 mm and 10 mm. The illumination system according to the disclosure can be used to illuminate areas F in the image plane with F>4 mm² (e.g., F>10 mm², F>20 mm², F>25 mm²). For a rectangular field, the area equals $F = D_x \times D_y$.

For a ring field, the ring field radius $D_r$ can be larger than 15 mm or even more in the image plane 2102.

If the projection objective is a reducing projection objective, for example with a reduction ratio of 4×, the object field will have dimensions of 4 mm×100 mm if the image field has dimensions of 1 mm×25 mm. With a known reduction ratio of the projection objective, (e.g., 4×, 5×) an individual skilled in the pertinent art can deduce the dimensions of the object field from the dimensions of the image field.

Figure 1E:
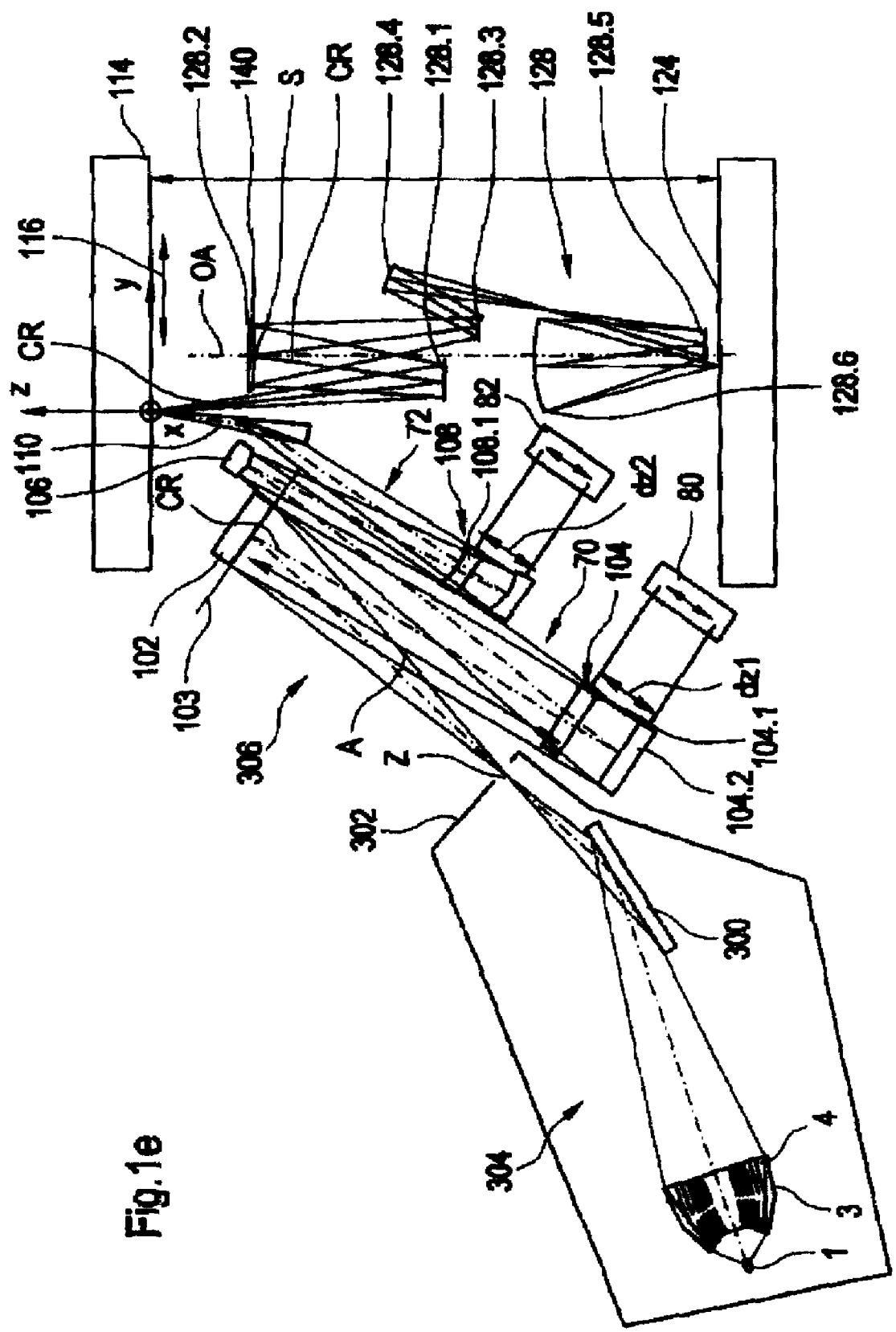
FIG. 1e shows a view of a projection exposure apparatus according to the disclosure with the individual optical elements.

In the ring field segment 2700, the y-direction of the coordinate system indicates the so-called scanning direction if the illumination system is used in a scanning microlithography projection system of the kind shown in FIG. 1e, while the x-direction indicates the direction perpendicular to the scanning direction. Scan-integrated quantities, i.e. quantities that are integrated along the y-axis, can be determined as a function of the x-position, which is also referred to as the so-called field height. Many quantities of an illumination are field-dependent quantities. One such field-dependent quantity is for example the so-called scanning energy (SE) for which a different magnitude is found dependent on the filed height x, meaning that the scanning energy is a function of the field height, conforming to the general expression $$SE(x) = \int E(x,y)dy,$$

wherein E stands for the intensity distribution in the x-y field plane, which is dependent on x and y. For a uniform, i.e. evenly distributed illumination and other characteristic quantities of the illumination systems such as the ellipticity and the telecentricity which likewise depend on the field height x, it can be of advantage if these quantities have substantially the same value along the entire field height x with only small deviations.

FIG. 1e shows a view of a projection exposure apparatus, for example for the manufacture of microelectronic components, where the disclosure can find application, wherein the individual elements of the illumination system and of the projection objective are illustrated. The system that is represented here is a catoptric system with a catoptric illumination system 306 and a catoptric projection objective 128. Since the illustrated system is a catoptric system, all of the optical components or elements are reflective, configured for example as mirrors or mirror elements.

The projection exposure apparatus in this example includes a light source or an intermediate image Z of a light source 1. The light emitted from the light source 1 is gathered by a collector 3 which comprises a multitude of mirror shells. In the projection exposure apparatus as shown here, the collector is followed by a further optical element which is in this case constituted by a planar mirror 300. The rays coming from the collector and falling on the planar mirror 300 are given a change in direction in particular for the purpose of providing space for the mechanical and optical components in an object plane 114 where the wafer stage is arranged. Also shown is the x-y-z coordinate system in the object plane. A mask, also referred to as reticle (not shown), can be arranged in the object plane 114, an image of which is projected into an image plane 124 via the projection objective 128. The planar mirror 300 can also be configured as a diffractive spectral filter element. A diffractive spectral filter element of this kind is for example a diffraction grating as disclosed in US 2002/0186811 A1. Together with an aperture stop 302 close to the intermediate image Z of the light source 1, a grating elements of the kind allows unwanted radiation, for example with wavelengths longer the desired wavelength, to be kept from entering the part of the illumination system 300 that lies behind the aperture stop 302.

The aperture stop 302 can also perform the function of separating the space 304 that contains the light source as well as the collector 3 and the planar mirror 300 that is configured as a grating from the part of the illumination system 306 that follows in the downstream direction. If the two spaces are separated by arranging a valve near the intermediate focus, one can also achieve a pressure differential. With a spatial separation or a pressure differential, one can prevent that contaminations originating from the light source could penetrate the illumination system 1 in the area behind the aperture stop 302.

The light collected by the collector 3 and redirected by the planar mirror 300 is directed to a first optical component 70 of the illumination system. The first optical component 70 includes a first facetted optical element 102 and a second facetted optical element 104. The first facetted optical element 102 is in this case a facetted catoptric element, specifically a mirror with a multitude of first catoptric raster elements, so-called field facet mirrors. The design of a first facetted optical element of this type is illustrated in FIG. 2.

The raster elements in the present case are substantially of rectangular shape and configured as individual mirror facets. To achieve that secondary images of the light source are formed in or near the pupil facets of the second optical element 104, the first raster element as shown in FIG. 2, which are also referred to as field facets, have a positive refractive power. The illumination in the plane in which the first facetted optical element 102 is arranged in substantially circle-shaped. Each mirror shell of the collector illuminates a circular area, and all of the illuminated circular area directly adjoin each other in the plane 103. An illumination of the type is described for a collector for example in US 2003/0043455 A1.

Besides the first facetted optical element 102, the first optical component 70 of the illumination system 306 includes a second facetted optical element 104 with second raster elements, so-called pupil facets. FIG. 2 shows the second facetted optical element in two positions 104.1, 104.2. The second facetted optical element is a second facetted catoptric element, specifically a mirror with a large number of second catoptric raster elements, so-called pupil facet mirrors.

The first facetted optical element 102 with field facets subdivides the incident light coming from the light source into several light bundles (not shown). Each of the individual light bundles belonging to a respective field facet falls on one of the pupil facets. Thus, there is a one-to-one correlation between each field facet of the first facetted optical element and a specific facet of the second facetted optical element. As shown in US 2002/0136351 A1 or U.S. Pat. No. 6,658,084, this correlation can determine the shape of the illumination, i.e., the illumination setting in the exit pupil of the illumination system. The illumination or the illumination setting in the exit pupil can be of conventional shape (i.e. a filled-out circle), annular (i.e. a closed circular ring), dipole-shaped (two spots opposite e each other), or quadrupole-shaped (four spots offset from each other by 90°).

Normally, the exit pupil of the illumination system is given by the point of intersection S where the principal ray CR that belongs to the central field point in the field to be illuminated in the field plane 114 intersects the optical axis OA of a projection objective which in a projection exposure apparatus follows downstream in the light path after the illumination system. For a system of this type, the exit pupil of the illumination system coincides with the entry pupil of the projection objective. In the present example, this exit pupil is identified by the reference numeral 140.

In the illustrated illumination system, the distance A between the first facetted optical element 102 and the second facetted optical element 104 can be varied. The distance A is determined by the length of the light path from the first facetted optical element 102 to the second facetted optical element 104 along the principal ray Cr that belongs to the central field point in the field plane. In the present example, the distance A is obtained by moving the second facetted optical element 104 by a distance dz1, for example via a first adjusting device 80. The first facetted optical element 201 remains stationary in this process. This can be advantageous, but not an absolute requirement. The first facetted optical element 102 can be arranged in a convergent, divergent, or parallel light bundle. The first facetted optical element 102 is in the present case arranged in a divergent light bundle. Following the first facetted optical element 102, the ray pattern between the first facetted optical element 102 and the second facetted optical element 104 has the property that all median rays of the ray bundles that originate from the individual field facets of the first facetted optical element 102 run parallel to each other, so that even when the second facetted optical element 104 is moved from a first position 104.1 into a second position 104.2, the light bundles are received by the pupil facets of the second facetted optical element 104 that correlate to respective field facets of the first facetted optical element. Changing the distance between the first facetted optical element 102 and the second facetted optical element 104 influences only the field image, while the pupil image is not affected, meaning that the pupil image cannot be changed by the change in position.

The second optical component in the present example has three optical elements, i.e. a first optical element 106, a second optical element 108 and a third optical element 110. The third optical element 110 in the illustrated illumination serves substantially the purpose of forming the field in the object plane 114. The field in the object plane 114 is normally a segment of a circle as shown in FIG. 1d. The focal length of the second optical component 72 is determined by the optical power and the respective distances

- between the second facetted optical element 104 of the first component and the first optical element 106,
- between the first optical element 106 and the second optical element 108,
- between the second optical element 108 and the third optical element 110, and
- between the third optical element and the object plane 114.

It is therefore possible to change the focal length of the second optical component by changing one of the aforementioned distances via a second setting device 82, for example by moving the second optical element by a distance dz2. If the focal length of the second optical component is changed, this will cause a change in the field image as well as in the pupil image. The change of the field image can be compensated as described above by changing the distance between the first facetted optical element and the second facetted optical element, so that the field to be illuminated in the field plane remains largely unaffected in its shape as well as well as in the strength of the illumination, i.e. the field image is non-variant, while the pupil image changes. In some embodiments, in the second optical component, too, only one element is moved, in this case the second optical element, by a distance dz2, using a second setting device 82. This is indicated in FIG. 1e by the positions 108.1 and 108.2 of the second optical element.

Arranged in the object plane 114 is a mask, specifically a reticle, which is illuminated via the illumination device and projected via the projection objective 128 into an image plane 124. If the apparatus is a scanning system, the reticle is arranged in the object plane 114 so that it can be moved in the scanning direction 116 which coincides with the y-direction. The exit pupil of the illumination system coincides with the entry pupil of the projection objective 128.

The projection objective 128 in the illustrated embodiment has six mirrors 128.1, 128.2, 128.3, 128.4, 128.5, and 128.6 and has, for example, the configuration described in U.S. Pat. No. 6,600,552 B2.

The projection objective 128 projects an image of the reticle (not shown) in the object plane 114 into the image plane 124.

FIG. 2 represents the first facetted optical element 102 of FIG. 1. The total area A1 illuminated by the collector 3 of FIG. 1 is defined by a border 400.1 which is set by the outermost mirror shell and an inner border 400.2 which comes from the innermost aperture element.

The illumination of the field facet plane in the illustrated embodiment is annular, due to the collector 3. It is further possible to recognize the reflective field facets 2005 of the first facetted optical element 102 of FIG. 1e. The individual field facets 2005 are in this case mirror elements which are arranged on a carrier (not shown). The field facets 2005 in the present embodiment with a field-forming mirror are substantially of rectangular shape. Also shown in the drawing is the center MF of a field facet from which a median ray (not shown) originates which is directed to the midpoint MP of a pupil facet that is shown in FIG. 3.

FIG. 3 illustrates an arrangement of two second raster elements, i.e. pupil facets 2007 on the second facetted optical element which is identified in FIG. 1e with the reference numeral 104. The pupil facets 2007 in the embodiment shown her are arrange in such a way that the median rays of the individual ray bundles that run from each field facets to the associated pupil facet run substantially parallel to each other. The median rays are those rays which are directed from the center MF of a field facet 2005 of FIG. 2 to the center of a pupil facet shown in FIG. 3. Due to the fact that the median rays run parallel, the mutual relationship between field facets and pupil facets is preserved even after the position of, e.g., the second facetted component has been changed. To visualize how the individual field facets 2005 of the first facetted optical element correlate to the pupil facts 2007 of the second facetted optical element, FIG. 3 shows for the first block 2009 consisting of the pupil facets 2007.1, 2007.2, 2007.3 the respectively correlated field facets 2005.1, 2005.2, 2005.3 of the first faceted optical element of FIG. 2 in broken lines. The respective field facets carry the same reference numerals also in FIG. 2. As can be seen in FIG. 3, the midpoint MP of each pupil facet coincides with the midpoint MF of the respective field facet. This requires that the median rays of the ray bundles running from each of the field facets 2005 to the respective pupil facets 2007 are parallel to each other. As can further be seen in FIG. 3, the arrangement of the pupil facets in blocks 2009 substantially matches the arrangement of the field facets in blocks 2011. Also shown in FIG. 3 is the x-y-z coordinate system. The shape of the pupil facets 2007 can match the shape of the secondary light sources in the plane where the second facetted optical element with pupil raster elements is arranged. The pupil facets as well as the field facets are for example individual mirrors that are arranged on a carrier structure.

Figure 4:
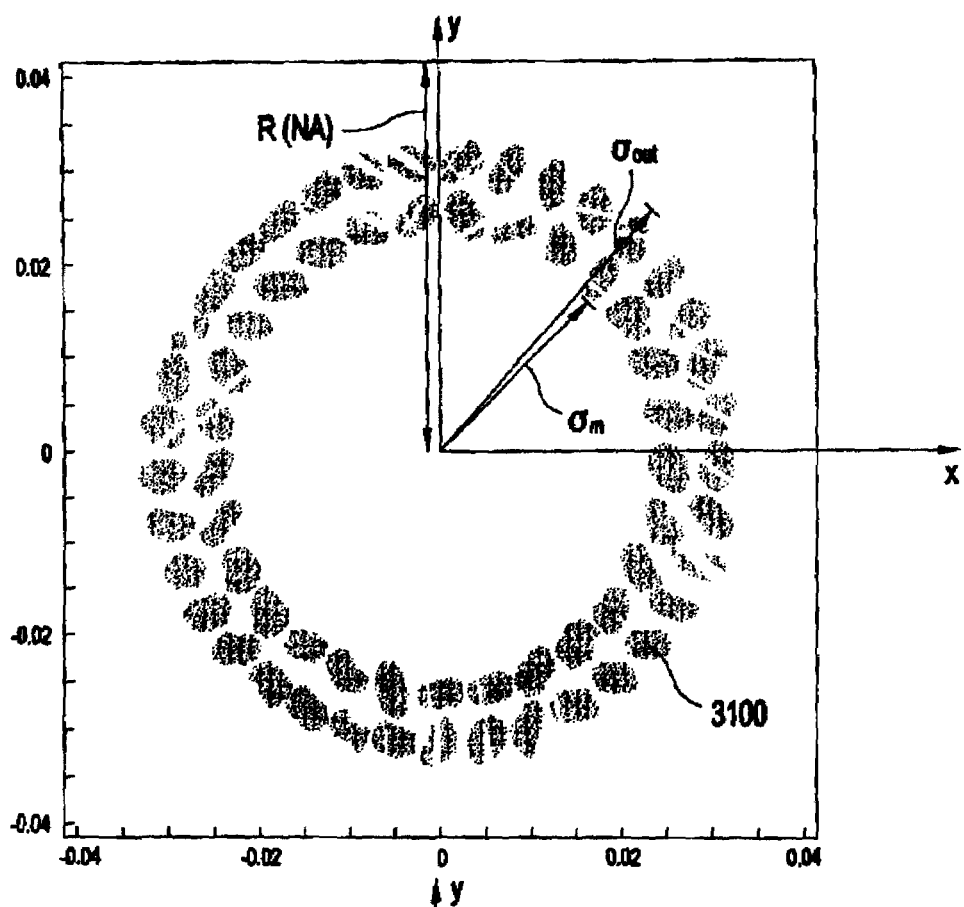
FIGS. 4-5 illustrate different illuminations in a pupil plane of the illumination system.
Figure 5:
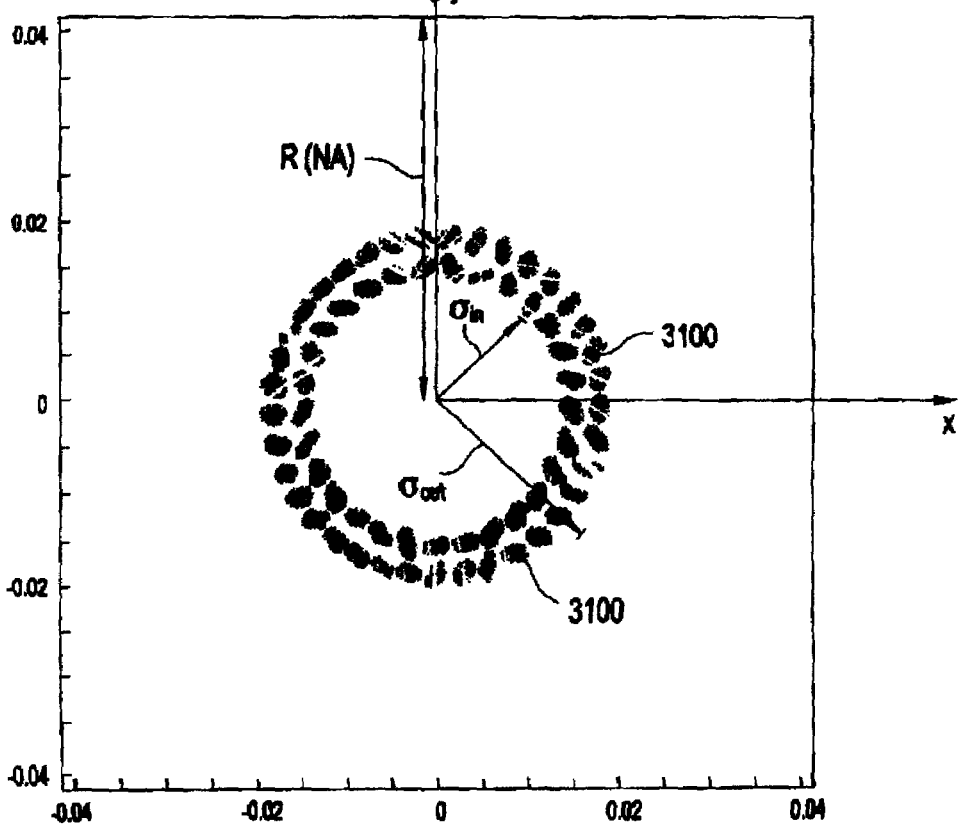

FIGS. 4 and 5 show two illuminations or illumination settings of the pupil to illustrate a case where the second facetted optical element of the first component and the second optical element of the second component are set into two different positions. The illumination or illumination setting shown in FIGS. 4 and 5 is an annular setting with a filling ratio σ which describes the degree of illumination coverage, i.e. the size of the illuminated area in the pupil plane. Individuals of ordinary skill in the art will be sufficiently well acquainted with the definition of the filling ratio σ.

A can be seen in FIGS. 4 and 5, the difference between the two illumination settings lies essentially in the filling ratio σ, in the amount or magnitude of the illumination coverage, while the shape of the illumination settings is essentially the same, i.e. an annular shape.

As shown in FIGS. 4 and 5, the exit pupil in the exit pupil plane has individual sub-pupils, that is to say tertiary light sources 3100. The difference between the respective levels of illumination coverage in FIGS. 4 and 5 is due only to a change in the imaging ratio of the individual sub-pupils 3100, since the only action taken is a position change, which causes a change in the scale ratio. On the other hand, there is no change in the number of the illuminated sub-pupils 3100 in the exit pupil. This has in particular the consequence that the integral light intensity in the exit pupil is largely the same for both illumination settings, i.e., the strength of the illumination in the field plane in the illumination system is not changed by a change of the illumination settings. It remains largely constant in a field plane such as, e.g., the object plane of the illumination system as well as in a pupil plane such as, e.g., the exit pupil of the illumination system when a change is made in the illumination setting. In FIG. 4, $\sigma_{in}$ and $\sigma_{out}$ as well as R(NA) are indicated for the illumination system represented here. In FIG. 5, $\sigma_{in}'$ and $\sigma_{out}'$ are shown. The quantities $\sigma_{in}$ and $\sigma_{out}$ describe in essence the radii of the annular illumination and thus define the magnitude of the annular illumination-coverage, i.e. the filling ratio σ.

The illumination shown in FIG. 4 is obtained if the second facetted optical component 104 in FIG. 1 as well as the second optical component 108 in FIG. 1 are brought to their first positions. If the second facetted optical component 104 is moved by a distance dz1 and the second optical component 108 by dz2, the illumination shown in FIG. 5 is obtained. With a position change by dz1, the second facetted optical component is brought from the position 104.1 to the position 104.2. If the second optical component 108 is moved by dz2, the second optical component is brought from the position 108.1 to the position 108.2.

Figure 6:
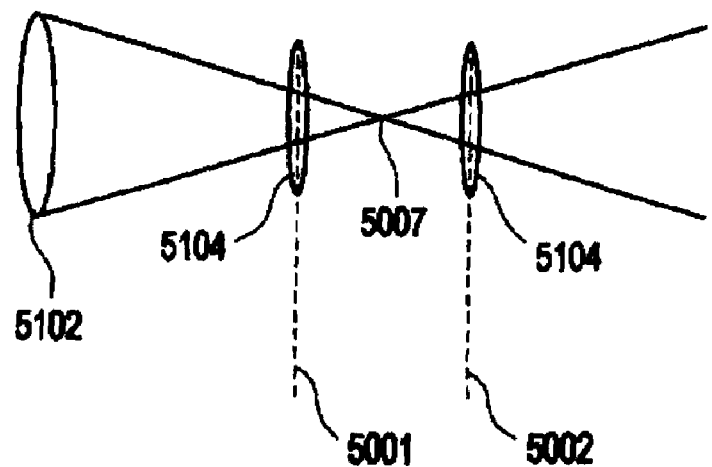
FIG. 6 shows the arrangement of the pupil facets in two positions with substantially equal distances to the secondary light sources.

If exactly two illuminations are to be realized with the system of the foregoing description, i.e. two illumination settings with different filling ratios σ as shown for example in FIGS. 4 and 5, it can be advantageous if the refractive power is selected in accordance with FIG. 6 in such a way that the secondary light sources that are produced by the field facets will lie substantially in the middle between the first position 5001 of the second facetted optical element 5104 and the second position 5002 of the second facetted optical element 5104. This has the consequence that due to the de-focused illumination in the first and in the second position of the second facetted optical element, the illuminated area on the second facetted optical element has an elliptical shape. Since the distance to the actual secondary image of the light source is substantially the same for the two positions, the shape of the illuminated area on the pupil fact mirror is the same in both positions. The individual pupil facets can be adapted to the illumination, for example by giving the pupil facts an elliptical shape.

Figure 7:
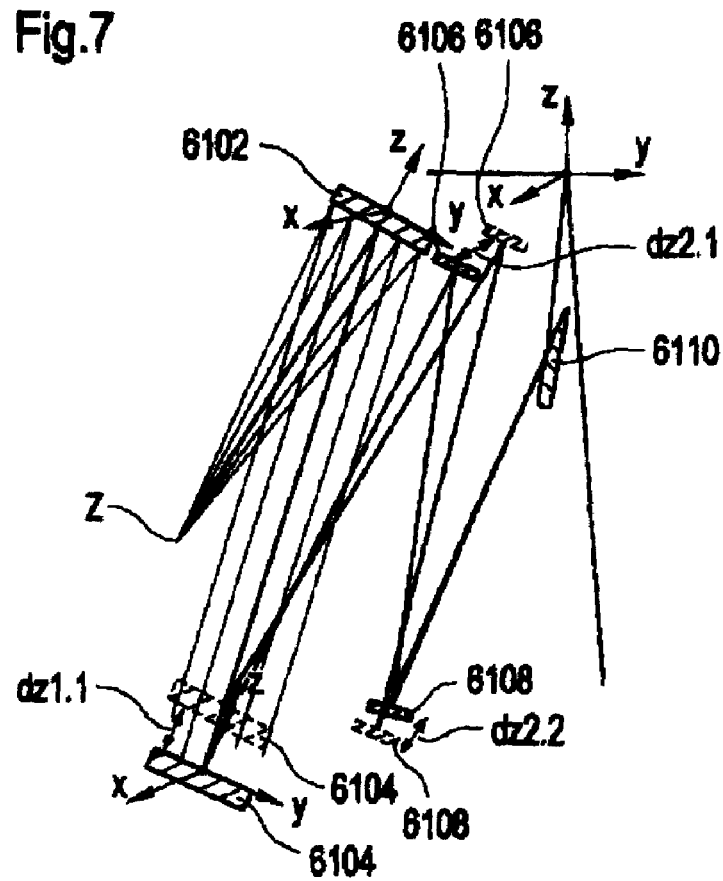
FIG. 7 shows a first embodiment of a system according to the disclosure with field-forming mirrors.

FIGS. 7 and 8 are schematic illustrations of two examples of the disclosure, wherein the illustrated part of the system begins with the intermediate image Z.

As in the system shown in FIG. 1e, the system according to FIG. 7 likewise comprises field facets of a substantially rectangular configuration as well as a third optical component 6110 for shaping the field. Components that are analogous to the system of FIG. 1 are identified by the same reference numerals to which 6000 has been added. As in the system of FIG. 1, the distance A between the first facetted optical element 6102 and the second facetted optical element 6104 is changed in the system of FIG. 7 by moving the second optical element 6104 by an amount dz1.1. To set the focal length of the second optical component, the first optical element 6106 as well as the second optical element 6108 of the second optical component are moved by a distance dz2.1 and dz2.2, respectively. As can be seen in FIG. 7, the optical components are moved not only along the local optical axis, i.e. in the z-direction of the optical element, but also at an angle relative to the z-axis, unlike in refractive optical elements. Only with the movement directed at an angle to the z-axis, i.e. tilting about the local optical axis, is it possible to achieve that the location of the intermediate focus Z of the light source will not change its position relative to the reticle in the reticle plane 114, and that consequently the light source does not have to be moved when the positions of the optical components are changed. In FIGS. 7 and 8, the local x-y-z coordinate systems for the facetted optical elements 6102, 6104, 7102, 7104 of the illumination system are shown which are obtained by a translatory movement in the z-y plane and a subsequent rotation of the x-y plane by and angle γ about the local x-axis of the optical element.

The field facets in the system of FIG. 8 have the shape of the field and are substantially of an arcuate shape. As can be seen in FIG. 8, the third optical element 7110 of the second optical component is a planar mirror, due to the fact that no field forming is required. In contrast to the system according to FIG. 7, the focal width of the second optical component is changed by moving the first optical component 7106 and the second optical component 7108 along the direction of a principal ray CR belonging to the central field point by the distances dz2.3 and dz2.4. Further, the distance between the first facetted optical component 7102 and the second facetted optical component 7104 is changed by moving the second facetted optical component by dz1.2. In the shaping of the field via a grazing-incidence mirror as shown if FIG. 6, one encounters the problem that this mirror is not located in a field plane, but rather about 300 to 400 mm ahead of the field plane. As a consequence, the mirror additionally worsens the pupil properties and, besides, produces field shapes that differ slightly from each other. Rays coming from two different pupil facets meet the field-shaping mirror at different locations and at different angles of incidence. As a result, slightly different shapes of the field are obtained.

An example of the disclosure is presented in FIGS. 9a and 9c as well as in the following Table 1, wherein a different size of the illuminated area in the pupil plane, i.e. a different setting σ can be produced by moving the pupil fact mirror relative to the field facet mirror and by moving the second element relative to the first optical element of the second optical component as listed in Table 1. The shape of the illumination is in this case circular, i.e. the illumination setting is a circular setting with an adjustable filling ratio σ. The filling ratio for a circular illumination setting is defined by the expression $$\sigma = \frac{r}{R_{NA}}.$$

Figure 9A:
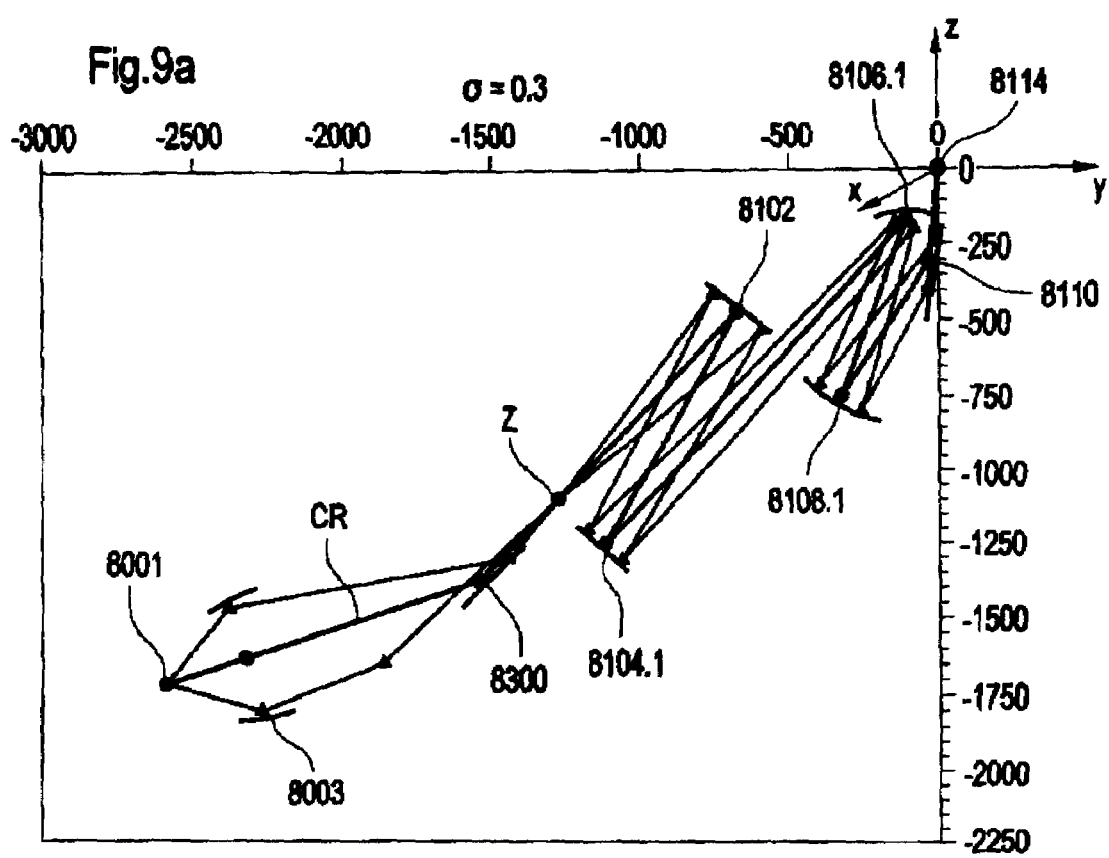
Figure 9B:
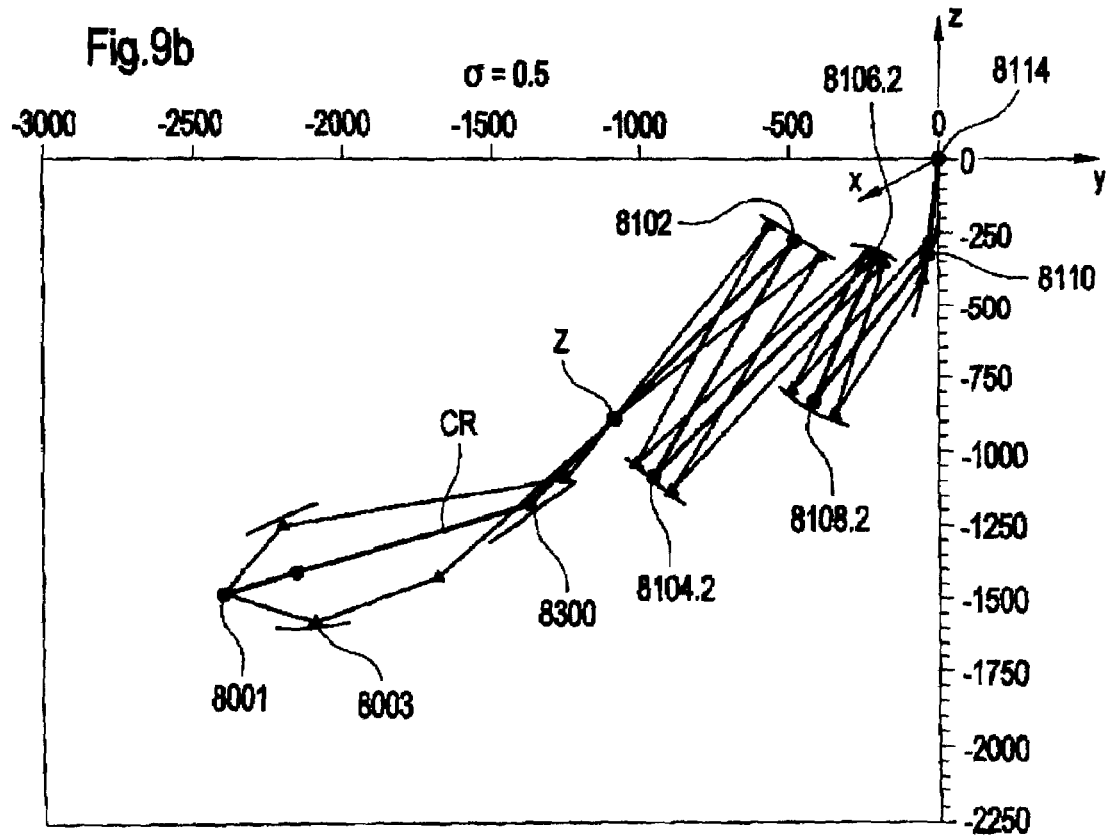

The individual components are in FIGS. 9a to 9c are identified by the same reference numerals as in FIG. 1, which have been raised by 8000.

The radius of the field facets of the first facetted component 8102 is R=904.25 mm.

The radius of the pupil facets of the second facetted optical element which is brought into the three positions 8104.1, 8104.2, 8104.3 is R=1090.3 mm. The radius of the first optical element of the second optical component, which can be set to the positions 8106.1, 8106.2 and 8106.3 is R=250.6 mm.

The radius of the second optical element of the second optical component, which is set into the positions 8108.1, 8108.2 and 8108.3 is R=−829.4 mm. The field-shaped mirror 8110 is an aspherical mirror with a radius in the x-direction of $R_x$=305.3 mm and a radius $R_y$ in the y-direction of 4716.5 mm. The data relate to the respective local coordinate systems of the optical elements which are obtained by a translatory displacement and a rotation of the coordinate system that has its origin in the central field point in the object plane 8114.

FIGS. 9a, 9b and 9c further show the local coordinate system in the object plane 8114. Indicated are in this case the y-direction as well as the z-direction and the x-direction. In the presentation of FIGS. 9a to 9c, the system is shown in a common meridional plane, i.e. in the plane that contains the z-axis of the individual local coordinate systems. As described above and known to those who are skilled in the relevant art, the local coordinated system are obtained from the reference coordinate system in the object plane by a translatory displacement and a rotation.

Further indicated in FIGS. 9a to 9c is the principal ray CR of the illuminated field in the object plane 8114. The values listed in the following Table 1 for the distances between the individual optical elements are defined as distances along the principal ray CR through the central field point in the field plane and between the individual optical components in the order in which they are encountered by following the ray path in the direction of the light propagation.

Listed in Table 1 are the filling ratio σ of the illumination setting and the distances as defined above of the individual components of the embodiments that are shown in FIGS. 9a to 9c. The illumination setting is a circular illumination setting.

The illumination setting can be adjusted continuously by making changes in the distances as described above. Listed in Table 1 and given as examples are the exact values for three settings with a filling ratio of σ=0.3, σ=0.5, and σ=0.8, respectively. As can be seen in particular, a setting variation of more than 40% is possible in relation to an intermediate filling ratio of σ=0.5. Individuals who are well versed in this field can generate any other values for σ with the help of the foregoing explanation.

TABLE 1

Distances in mm along the principal ray CR, proceeding in the direction traveled by the light from the light source to the reticle plane, between

| FIG. | σ | first facetted component (8102) and second facetted component (8104.1, 8104.2, 8104.3) | second facetted component (8104.1, 8104.2, 8104.3) and second optical element (8106.1, 8106.2, 8106.3) | first optical element (8106.1, 8106.2, 8106.3) and second optical element (8108.1, 8108.2, 8108.3) | second optical element (8108.1, 8108.2, 8108.3) and grazing-incidence mirror (8110) | grazing-incidence mirror (8110) and reticle (8114) |
|---|---|---|---|---|---|---|
| 10a | 0.3 | 913 | 1470 | 600 | 515 | 320 |
| 10b | 0.5 | 957 | 1070 | 550 | 632.8 | 320 |
| 10c | 0.8 | 1038 | 935 | 480 | 909.45 | 320 |

With the present disclosure, a catoptric system is presented for the first time, in which the illuminated pupil area, in particular the adjustment of the setting, is achieved by a simple displacement and change of the distance between optical elements of the illumination system.

In particular, the disclosure makes it possible for the first time in catoptric illumination systems, i.e. in reflective illumination systems, for example of the type used for EUV lithography, to adjust an illumination setting in a continuous manner. In contrast to conventional systems, a continuous adjustment of this kind avoids on the one hand a loss of intensity that can be caused for example by aperture stops, and as a second advantage allows a continuous setting. Furthermore, the continuous adjustment of the setting as described here is straightforward in its realization.

As a further advantage, the number of sub-pupils remains substantially with the change in the setting, which ensures that the strength of the illumination in the field plane of the illumination system remains substantially unchanged.

The invention claimed is:

1. A catoptric illumination system with a light source which during operation of the catoptric illumination system emits a radiation, wherein the radiation illuminates a field in a field plane and at the same time provides an illumination in a pupil plane, wherein the illuminated area in the pupil plane has a size which can be continuously varied, the illumination system comprising:
   a number of optical elements arranged in such a way that the radiation is directed from the light source to the field plane and to the pupil plane,
   wherein a distance between at least two optical elements of the number of optical elements is variable, the two optical elements include at least one facetted optical element, and the illuminated area in the pupil plane has a shape, and said shape of the illuminated area in the pupil plane remains unchanged when the distance between the at least two optical elements is varied.

2. The catoptric illumination system according to claim 1, wherein the illumination in the field plane remains unchanged.

3. The catoptric illumination system according to claim 1, wherein the size of the illuminated area in the pupil plane can be varied by ±10%.

4. The catoptric illumination system according to claim 1, wherein the size of the illuminated area in the pupil plane can be varied by ±25%.

5. The catoptric illumination system according to claim 1, wherein the size of the illuminated area in the pupil plane can be varied by ±40%.

6. The catoptric illumination system according to claim 1, wherein the radiation has a wavelength λ and the magnitude of said wavelength is $\lambda \leq 193$ nm.

7. The catoptric illumination system according to claim 6, wherein the wavelength is $\lambda \leq 14$ nm.

8. The catoptric illumination system according to claim 1, wherein the shape of the illuminated area in the pupil plane is circular.

9. The catoptric illumination system according to claim 8, wherein the size of the illuminated area in the pupil plane is characterized by a filling ratio σ, and wherein the filling ratio σ can be varied by ±10%.

10. The catoptric illumination system according to claim 8, wherein the size of the illuminated area in the pupil plane is characterized by a filling ratio σ, and wherein the filling ratio σ can be varied by ±25%.

11. The catoptric illumination system according to claim 8, wherein the size of the illuminated area in the pupil plane is characterized by a filling ratio σ, and wherein the filling ratio σ can be varied by ±40%.

12. The catoptric illumination system according to claim 1, wherein the shape of the illuminated area in the pupil plane is annular.

13. The catoptric illumination system according to claim 1, wherein the illuminated area in the pupil plane is multi-polar.

14. The catoptric illumination system according to claim 1, wherein the illuminated area in the pupil plane is dipolar.

15. The catoptric illumination system according to claim 1, wherein the illuminated area in the pupil plane is quadrupolar.

16. The catoptric illumination system according to claim 1, wherein the number of optical elements comprises a further facetted optical element.

17. The catoptric illumination system according to claim 1, wherein the number of optical elements comprises at least one optical element with a near-normal incidence of the light.

18. The catoptric illumination system according to claim 17, wherein the number of optical elements comprises at least one element with a grazing incidence of the light.

19. The catoptric illumination system according to claim 1, wherein the distance can be changed in a continuous manner.

20. The catoptric illumination system according to claim 1, wherein the at least two optical elements are two facetted optical elements.

21. The catoptric illumination system according to claim 1, wherein in the illumination system ahead of the field plane, an intermediate image is formed of the light source.

22. The catoptric illumination system according to claim 21, wherein the number of optical elements comprises a first multitude of optical elements which direct radiation from the light source to the intermediate image and a second multitude of optical elements which direct radiation from the intermediate image to the field plane and to the pupil plane, and wherein the second multitude of optical elements comprises at least one optical element with a near-normal incidence of the light.

23. The catoptric illumination system according to claim 22, wherein the second multitude of optical elements comprises at least one optical element with a grazing incidence of the light.

24. The catoptric illumination system according to claim 1, wherein the shape of the illuminated area in the pupil plane can be preset.

25. The catoptric illumination system according to claim 24, wherein the shape of the illuminated area in the pupil plane is changed by exchanging one optical element of the number of optical elements.

26. The catoptric illumination system according to claim 25, wherein the optical element is a facetted optical element.

27. A projection exposure apparatus comprising an illumination system according to claim 1 and a projection objective which produces in the image plane a projected image of the field in the field plane.

28. The projection exposure apparatus according to claim 27, wherein the image-side numerical aperture NA of the projection objective NA is larger than 0.2.

29. The projection exposure apparatus according to claim 27, wherein a maximum dimension $(D_x, D_y)$ of the field on the object side is larger than 10mm.

30. The projection exposure apparatus according to claim 29, wherein a maximum dimension $(D_x, D_y)$ of the field on the object side is larger than 80mm.

31. The projection exposure apparatus according to claim 30, wherein a maximum dimension $(D_x, D_y)$ of the field on the object side is larger than 104 mm.

32. A method for the manufacture of microelectronic components, using a projection exposure apparatus according to claim 27, comprising the following steps:

a mask is illuminated by the illumination system, and an image of the mask in the field plane is projected by means of a projection objective onto a light-sensitive coating in the image plane, so that after a subsequent developing step, the light-sensitive coating carries a structure.

\* \* \* \* \*

UNITED STATES PATENT AND TRADEMARK OFFICE
CERTIFICATE OF CORRECTION

PATENT NO. : 7,626,770 B2  Page 1 of 1
APPLICATION NO. : 11/696956
DATED : December 1, 2009
INVENTOR(S) : Wolfgang Singer and Jens Ossmann It is certified that error appears in the above-identified patent and that said Letters Patent is hereby corrected as shown below:

Column 12, line 24, delete "$D_y$," insert --$D_y$.--

Column 14, line 52, delete "Cr" insert --CR--

Column 22, line 23, Claim 29, delete "10mm" insert --10 mm.--

Column 22, line 26, Claim 30, delete "80mm" insert --80 mm.--

Signed and Sealed this

Sixteenth Day of February, 2010

David J. Kappos
*Director of the United States Patent and Trademark Office*